(12) United States Patent
Lai et al.

(10) Patent No.: US 8,502,534 B2
(45) Date of Patent: Aug. 6, 2013

(54) ACCELERATED DYNAMIC MAGNETIC RESONANCE IMAGING SYSTEM AND METHOD

(75) Inventors: Peng Lai, Foster City, CA (US); Philip James Beatty, Redwood City, CA (US); Anja Christina Sophie Brau, Menlo Park, CA (US)

(73) Assignee: General Electric Company, Schenectady, NY (US)

( * ) Notice: Subject to any disclaimer, the term of this patent is extended or adjusted under 35 U.S.C. 154(b) by 579 days.

(21) Appl. No.: 12/751,901

(22) Filed: Mar. 31, 2010

(65) Prior Publication Data

US 2011/0241670 A1 Oct. 6, 2011

(51) Int. Cl.
*G01V 3/14* (2006.01)
*G01R 33/48* (2006.01)

(52) U.S. Cl.
USPC ........... 324/309; 324/307; 324/318; 324/322; 600/410; 382/128

(58) Field of Classification Search
USPC ............................ 324/300–322; 600/407–464
See application file for complete search history.

(56) References Cited

U.S. PATENT DOCUMENTS

| | | | |
|---|---|---|---|
| 7,054,676 B2 | 5/2006 | Hedlund et al. | |
| 7,282,917 B1 | 10/2007 | Brau et al. | |
| 7,423,430 B1 * | 9/2008 | Sharif et al. | 324/309 |
| 7,439,739 B2 | 10/2008 | Beatty | |
| 7,486,074 B2 | 2/2009 | McKenzie | |
| 7,486,075 B2 | 2/2009 | Brau et al. | |
| 7,492,153 B2 * | 2/2009 | Brau et al. | 324/309 |
| 7,511,495 B2 * | 3/2009 | Kholmovski et al. | 324/310 |
| 7,619,410 B2 | 11/2009 | Beatty et al. | |
| 7,688,068 B2 | 3/2010 | Beatty et al. | |
| 7,692,425 B2 | 4/2010 | Brau et al. | |
| 7,693,569 B1 | 4/2010 | Brau et al. | |
| 7,768,264 B1 | 8/2010 | Brau et al. | |
| 7,840,045 B2 * | 11/2010 | Guo et al. | 382/128 |
| 8,073,522 B2 * | 12/2011 | Stemmer | 600/410 |
| 8,076,938 B2 | 12/2011 | Brau et al. | |
| 8,116,541 B2 | 2/2012 | Brau et al. | |
| 8,136,770 B2 | 3/2012 | Beatty et al. | |
| 8,355,551 B2 | 1/2013 | Thielemans et al. | |
| 2006/0050981 A1 * | 3/2006 | Huang | 382/254 |
| 2006/0208730 A1 * | 9/2006 | Kozerke et al. | 324/307 |

(Continued)

OTHER PUBLICATIONS

Tsao, Jeffrey, et al.; "k-t Blast and k-t Sense: Dynamic MRI With High Frame Rate Exploiting Spatiotemporal Correlactions"; Magnetic Resonance in Medicine 50:1031-1042 (2003).

(Continued)

*Primary Examiner* — Jermele M Hollington
*Assistant Examiner* — Emily Chan
(74) *Attorney, Agent, or Firm* — Fletcher Yoder, P.C.

(57) ABSTRACT

In one embodiment, a method for processing magnetic resonance imaging data is provided. The method includes accessing the magnetic resonance imaging data, the data including a plurality of image data sets defining reconstructable images representative of a subject at different points in time. Each data set includes sampled data for sampled phase encoding points but is missing data for unsampled phase encoding points. An adaptive time window is determined for each image data set, and the missing data of at least one of the image data sets is determined based upon the sampled data for the respective data set and sampled data from at least one other data set within the time window for the respective data set.

20 Claims, 7 Drawing Sheets

U.S. PATENT DOCUMENTS

| | | | |
|---|---|---|---|
| 2008/0048124 | A1 | 2/2008 | Pang et al. |
| 2008/0242972 | A1* | 10/2008 | Jung et al. .................. 600/410 |
| 2011/0241669 | A1 | 10/2011 | Chen et al. |
| 2011/0241676 | A1 | 10/2011 | Busse et al. |
| 2011/0241677 | A1 | 10/2011 | Busse et al. |
| 2012/0249145 | A1 | 10/2012 | Lai et al. |
| 2012/0262167 | A1 | 10/2012 | Lai et al. |

OTHER PUBLICATIONS

Huang, Feng, et al.; "kt Grappa: a k-space Implementation for Dynamic MRI with High Reduction Factor"; Magnetic Resonance in Medicine 54:1172-1184 (2005).

Fenchel, Michael, MD., et al.; "Renal Magnetic Resonance Angiography at 3.0 Tesla Using a 32-Element Phased-Array Coil System and Parallel Imaging in 2 Directions"; Investigative Radiology, vol. 41, No. 9, Sep. 2006, pp. 697-703.

Jung, Hong, et al.; "Improved k-t Blast and k-t Sense using Focuss"; Phys. Med. Biol. 52 (2007), pp. 3201-3226.

Beatty, P.J., et al.; "A Method for Autocalibrating 2-D Accelerated Volumetric Parallel Imaging with Clinically Practical Reconstruction Times"; Proc. Intl. Soc. Mag. Reson. Med. 15 (2007) pp. 1.

Xu, Dan, et al.; "Improving k-t Sense by Adaptive Regularization"; Magnetic Resonance in Medicine 57:918-930 (2007).

Brau, Anja C.S., et al.; "Comparison of Reconstruction Accuracy and Efficiency Among Autocalibrating Data-Driven Parallel Imaging Methods"; Magnetic Resonance in Medicine 59:382-395 (2008).

Lai, Peng, et al.; "Fast Four-Dimensional Coronary MR Angiography with k-t Grappa"; Journal of Magnetic Resonance Imaging 27:659-665 (2008).

\* cited by examiner

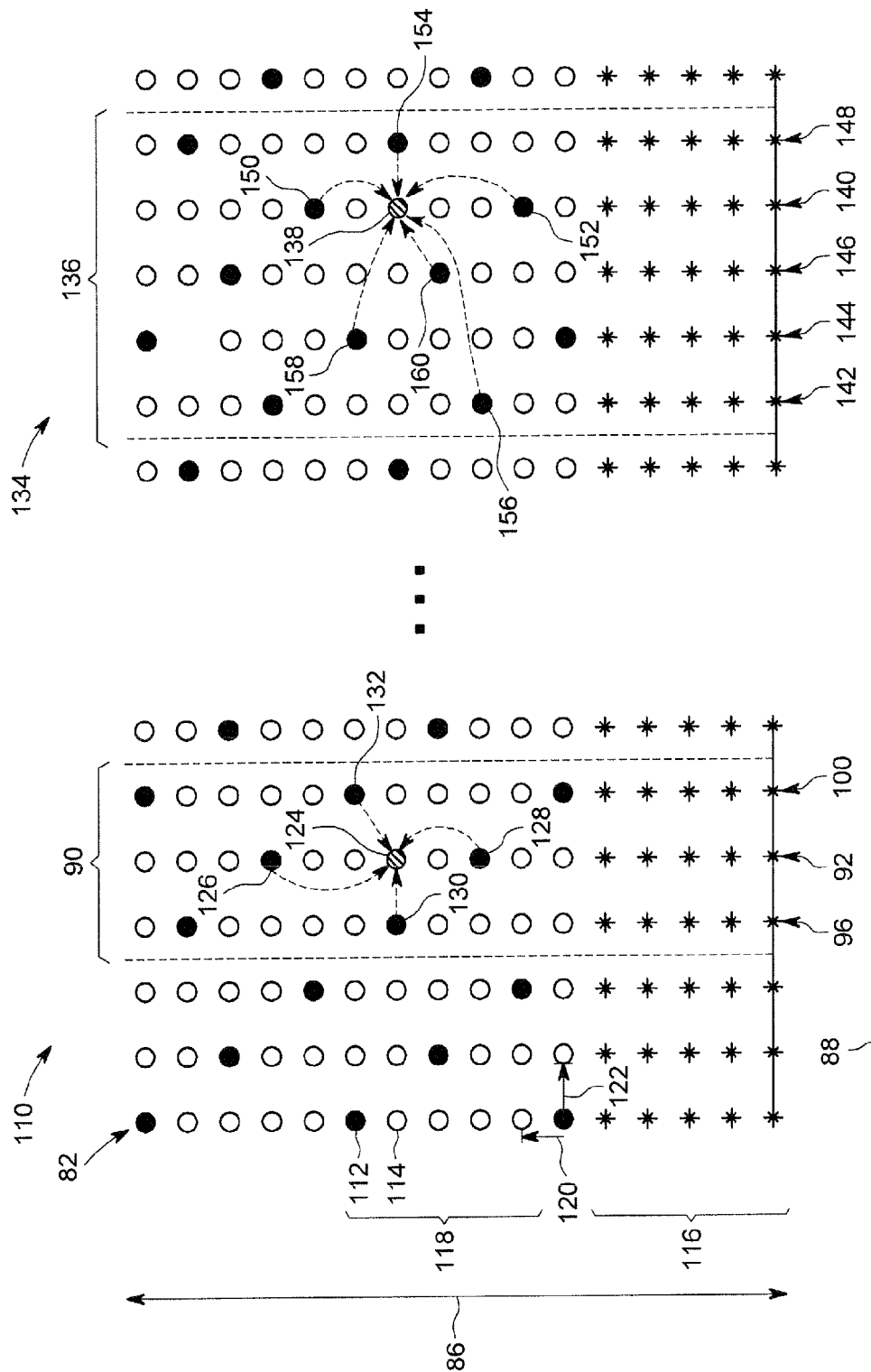

ACCELERATED DYNAMIC MAGNETIC RESONANCE IMAGING SYSTEM AND METHOD

BACKGROUND OF THE INVENTION

The present invention relates to magnetic resonance imaging data processing, and more specifically, to methods for synthesizing images from image data resulting from accelerated imaging techniques.

In general, magnetic resonance imaging (MRI) examinations are based on the interactions among a primary magnetic field, a radiofrequency (Rf) magnetic field and time varying magnetic gradient fields with gyromagnetic material having nuclear spins within the subject of interest. Certain gyromagnetic materials, such as hydrogen nuclei in water molecules, have characteristic behaviors in response to external magnetic fields. The precession of spins of these nuclei can be influenced by manipulation of the fields to produce Rf signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An Rf coil is employed to produce an Rf magnetic field. This Rf magnetic field perturbs the spins of some of the gyromagnetic nuclei from their equilibrium directions, causing the spins to precess around the axis of their equilibrium magnetization. During this precession, Rf fields are emitted by the spinning, precessing nuclei and are detected by either the same transmitting Rf coil, or by a separate coil. These signals are amplified, filtered, and digitized. The digitized signals are then processed using one or more algorithms to reconstruct a useful image.

Techniques have been developed to perform MRI imaging sequences quickly, so as to avoid long breath holds required of patients, or to obtain images of rapidly changing anatomies (e.g., the beating heart). Some such techniques acquire less than all of the information normally utilized for image reconstruction, requiring that the absent data be estimated in some way for proper, high quality image creation. However, current techniques for such estimation are often inadequate or subject to further improvement.

BRIEF DESCRIPTION OF THE INVENTION

The present techniques are intended to further improve image data acquisition and processing in such cases. In one embodiment, a method for processing magnetic resonance imaging data is provided. The method includes accessing the magnetic resonance imaging data, which includes a plurality of image data sets defining reconstructable images. The reconstructable images are representative of a subject at different points in time. Each data set includes sampled data for sampled phase encoding points but is missing data for unsampled phase encoding points. The method also includes determining an adaptive time window for each image data set and determining the missing data of at least one of the image data sets. The missing data is based upon the sampled data for the respective data set and sampled data from at least one other data set within the time window for the respective data set.

In another embodiment, a method for processing magnetic resonance imaging data is provided that includes accessing the magnetic resonance imaging data. The data includes a plurality of image data sets defining reconstructable images representative of a subject at different points in time. Each data set includes sampled data for sampled phase encoding points but is missing data for unsampled phase encoding points. The sampled phase encoding points of time-adjacent image data sets differ from one another by more than one phase encoding step. The method also includes determining a time window for each image data set and determining the missing data of at least one of the image data sets. The missing data is based upon the sampled data for the respective data set and sampled data from at least one other data set within the time window.

In a further embodiment, a method for processing magnetic resonance imaging data is provided. The method includes accessing the magnetic resonance imaging data, the data including a plurality of image data sets defining reconstructable images representative of a subject at different points in time. Each data set includes sampled data for sampled phase encoding points but is missing data for unsampled phase encoding points. The method also includes determining a time window for each image data set based upon calibration data in k-space. A 1D fast Fourier transform on the magnetic resonance imaging data is then performed to convert the magnetic resonance imaging data from data in k-space to data in hybrid space. The method further includes determining the missing data of at least one of the image data sets based upon the sampled data for the respective data set and sampled data from at least one other data set within the time window.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 3 is an illustration of an embodiment of a time-interleaved phase encoding array acquired in an accelerated two-dimensional imaging sequence, in accordance with an aspect of the present disclosure;

FIG. 4 is a diagrammatical illustration of an embodiment of a time-interleaved phase encoding array acquired in an accelerated two-dimensional imaging sequence, in accordance with an aspect of the present disclosure

DETAILED DESCRIPTION OF THE INVENTION

Figure 1:
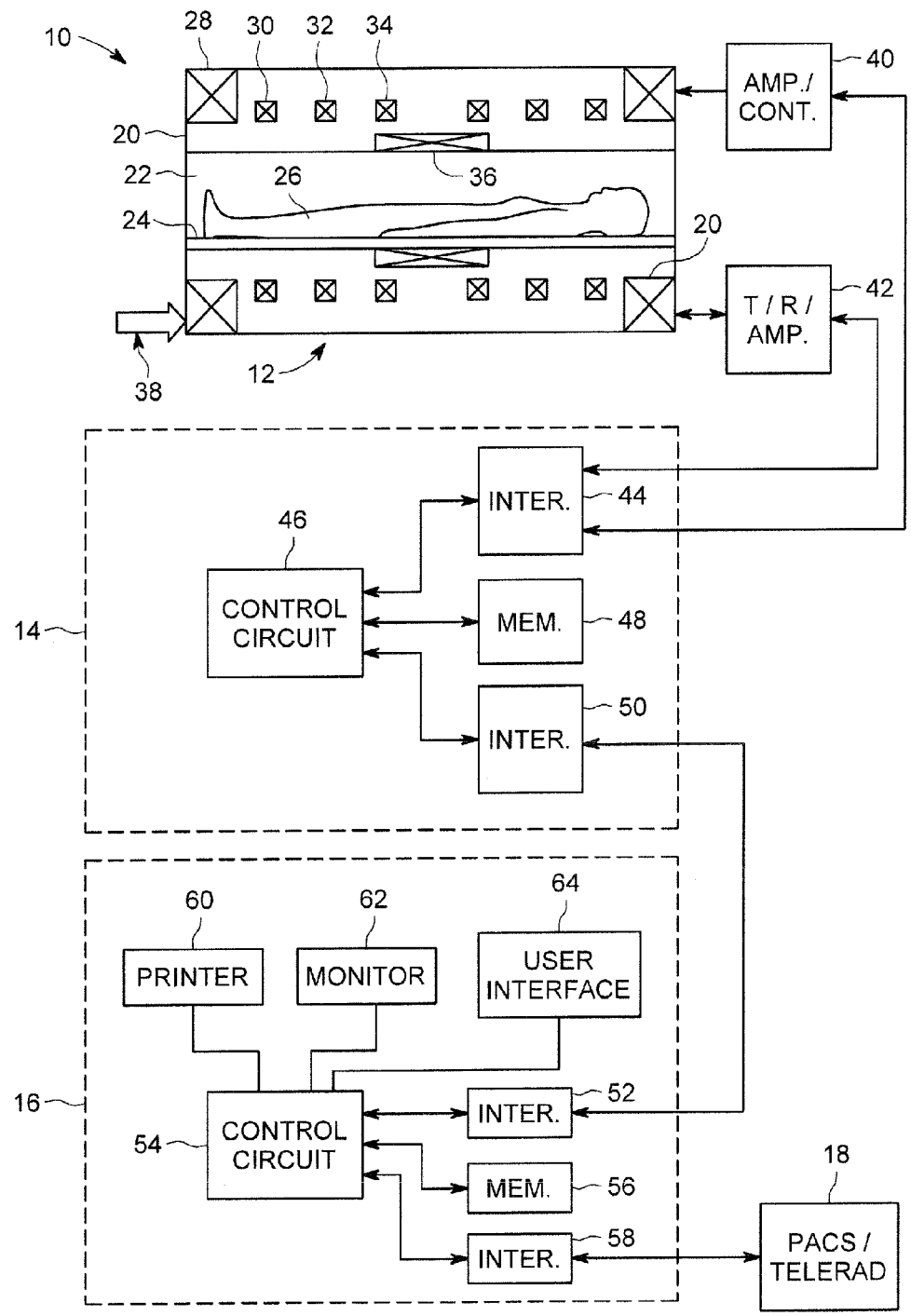
FIG. 1 is a schematic illustration of an embodiment of a magnetic resonance imaging system configured to perform accelerated imaging sequences and produce time-resolved images, in accordance with one aspect of the present disclosure.

In accordance with aspects of the present disclosure, an imaging technique is employed that is able to accelerate dynamic MRI by exploiting spatiotemporal correlations. To accelerate MRI sequences, one or both of the processes of data acquisition and data reconstruction may be accelerated to shorten the length of time suitable to obtain useful images. With computers exhibiting ever-increasing processing power, it may be possible to leverage highly accelerated data acquisition with higher demand on data reconstruction. Therefore, in certain imaging routines, acceleration in data acquisition may be achieved by undersampling data, for example in data space. That is, by not sampling every phase encoded or frequency encoded point, data acquisition may be accelerated, resulting in shorter imaging times. In the present disclosure, the acceleration is identified based on the number of consecutive data points not sampled in between each pair of sampled data points in an image data set representative of an image. For example, in a single image data set (a data space) representative of a two-dimensional (2-D) image at time $t_n$, three unsampled data points in between each pair of sampled data points could be described as having an acceleration factor (AF) of 4. That is, every fourth point is sampled. Four unsampled points in between each sampled pair could be described as having an AF of 5 wherein every fifth point is sampled, and so on.

According to present embodiments, unaliased images are achieved by synthesizing missing data using source data sampled at the same time point ($t_n$) and adjacent time points ($t_{n\pm x}$). In the present disclosure, undersampling in k-space is time-interleaved such that for an AF of R (e.g., 4), full k-space is acquired in each set of R adjacent time frames (e.g., 4 adjacent time frames). In one embodiment, to increase spatial correlation and temporal fidelity in data synthesis, the current approaches involve performing undersampling in k-t space with non-linear k-space shifting along time. That is, the sampled phase encoding points differ by more than one phase encoding step for each pair of time-adjacent image data sets. In certain of these embodiments, the overall image data difference (e.g., phase encoding difference) between immediately adjacent time points is reduced. Further, data acquisition may involve non-uniform sampling in image data sets (i.e. within one column of the k-t space), which acquires image data in k-t space with variable sampling density. That is, the acceleration factor along a phase encoding direction is not necessarily fixed. For example, the sampling pattern along $k_y$ may include an acceleration of 4, followed by an acceleration of 2, which is then followed by an acceleration of 3, and so on.

According to one embodiment of image reconstruction, Fourier transforming (e.g., fast Fourier transforming) along the readout direction, such as the frequency encoding axis $k_x$, converts k-space data sets at each time point to hybrid space data sets. That is, $k_y$-$k_x$ space is converted to $k_y$-x space. Then, missing data points within hybrid space are recovered via data synthesis in k- & adaptive-t space (kat), which may be a series of time-interleaved k-space or hybrid space data sets. Specifically, a missing line at time $t_n$ is synthesized by weighted-summing its source lines with the same or similar phase-encoding data acquired at time points with sufficient temporal fidelity with $t_n$. Selection of source time points for data synthesis is adaptive to variations of local temporal correlation and is self-determined based on differences in autocalibration signals (ACS) repeatedly sampled at each time point. This adaptive nature of the selection of the time points from which data is drawn for synthesis of the missing data may result in image data for different times receiving different contributions to the their respective data synthesis. Accordingly, the embodiments described herein may be useful in a variety of dynamic imaging implementations, such as 2D cardiac cine and 3D perfusion imaging, though they are not limited to such modalities. Indeed, any dynamic imaging modality may benefit from the approaches described herein.

The embodiments described herein may be performed by a magnetic resonance imaging (MRI) system, wherein specific imaging routines (e.g., accelerated imaging routines) are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as accelerated imaging sequences. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a subject 26 to be positioned therein for imaging selected anatomy within the patient.

Scanner 12 includes a series of associated coils for producing controlled magnetic field and for detecting emissions from gyromagnetic material within the anatomy of the subject being imaged. A primary magnet coil 28 is provided for generating a primary magnetic field generally aligned with the bore 22. A series of gradient coils 30, 32, and 34 permit controlled magnetic gradient fields to be generated during examination sequences. A radio frequency (Rf) coil 36 is provided for generating radio frequency pulses for exciting the gyromagnetic material, such as for spin perturbation or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the Rf coil 36. Circuit 42 will typically include a switching device for alternating between the active and passive modes of operation, wherein the Rf coils transmits and receives signals, respectively. Circuit 42 also includes amplification circuitry for generating the RF pulses and for processing received magnetic resonance signals.

Scanner control circuit 14 includes an interface circuit 44 which outputs signals for driving the gradient field coils and the Rf coil and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. For example, the programming code may execute one or more algorithms capable of performing accelerated imaging sequences and processing undersampled image data, which will be discussed in detail below. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith produce magnetic fields and radio frequency pulses in a controlled manner to excite and encode specific gyromagnetic material within the subject 26. The scanner 12 and control circuit 46 also sense the signals emanating from such material and create an image of the material being scanned. In certain embodiments, the scan may be an accelerated scan resulting in an array of undersampled image data sets. It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Figure 2B:
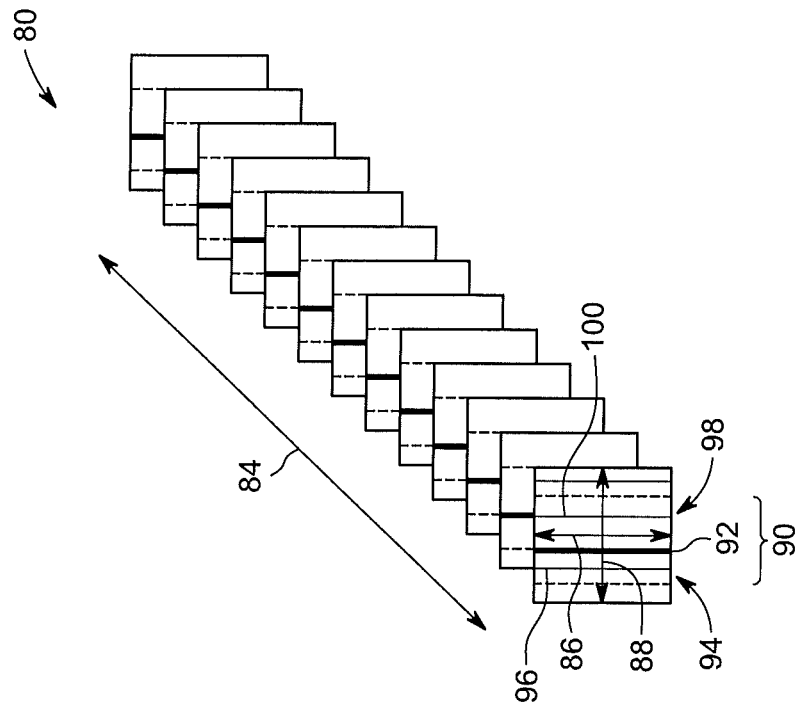
FIG. 2b is a diagrammatical illustration of the array of FIG. 2a, viewed from the perspective of k-t space rather than k-space, in accordance with an aspect of the present disclosure.
Figure 2A:
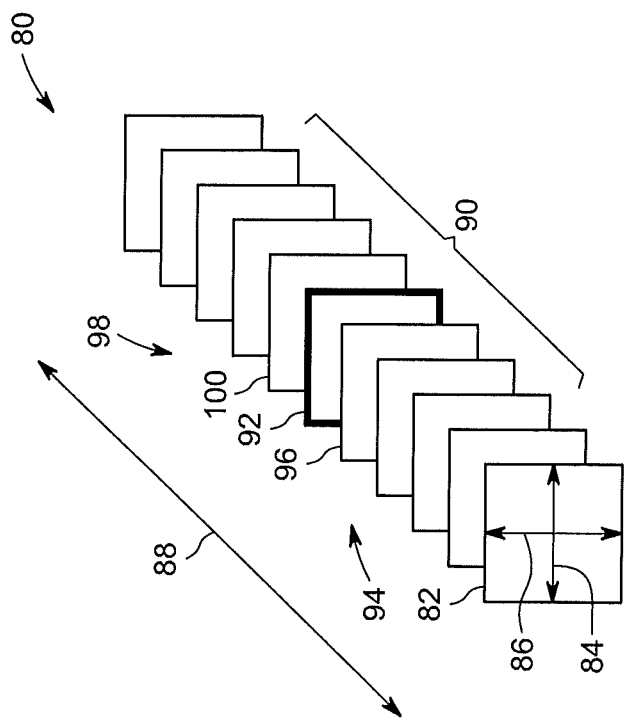
FIG. 2a is a diagrammatical illustration of an embodiment of an image data array containing image data sets in k-space, the data being representative of one or more anatomies of interest imaged over time, in accordance with an aspect of the present disclosure.

FIG. 2*a* illustrates one such embodiment of an image data array 80 acquired over time. The image data array 80 includes a plurality of image data sets 82, with each image data set 82 representing one image acquired at a specific time. According to present embodiments, each image data set 82 contains data that is representative of an image of one or more patient anatomies within the subject 26 (FIG. 1) resulting from an accelerated image data acquisition process. As noted above, in such an image data acquisition process, not all data from an area is collected in order to accelerate the imaging routine. Therefore, each image data set 82 has sampled data points and has areas or points that are missing information, which would result in artifacts in a reconstructed image. For the purposes of the present discussion, the sampled data is sampled phase encoding data and the missing data is missing phase encoding data. However, it should be noted that the present disclosure also applies to missing frequency encoding data or other missing image data.

More specifically, each image data set 82 may be a k-space data set, hybrid space data set, or any data set that is representative of image data or images. In the illustrated embodiment, the image data sets 82 are k-space data sets having a frequency encoding axis 84 and a phase encoding axis 86, with respective frequency and phase encoded data. That is, each image data set 82 is a Fourier plane. Therefore, when a phase encoding point or frequency encoding point is missing, a line in the Fourier plane remains unfilled. As illustrated, the image data sets 82 are stacked along a time axis 88. Accordingly, one image data set 82 below another image data set 82 indicates a time progression. In some embodiments, two or more of the image data sets 82 may be stacked or combined into a time window 90, which is specifically defined relative to an image data set of interest 92. The time window 90 is used to determine which adjacent data sets may be used for reconstructing missing image data (e.g., missing phase encoding data) within the image data set of interest 92. For example, the time window 90 includes the image data set of interest 92, preceding image data sets 94 (such as a preceding temporal neighbor 96), and subsequent image data sets 98 (such as a subsequent temporal neighbor 100). According to the present disclosure, data contained within any one or a combination of these image data sets may be used to determine the values for the missing data within the image data set of interest 92. Therefore, in some embodiments, temporal neighbors are used to construct full image data sets from undersampled data sets for image synthesis. Moreover, as described below, the particular number of adjacent data sets in the time window 90 for each respective data set in which data is to be synthesized is determined adaptively, and different data sets can and generally will have different numbers of adjacent time neighbors in their time windows.

FIG. 2*b* is a diagrammatical illustration of the embodiment depicted in FIG. 2*a*, but viewed down the perspective of the frequency encoding axis 84 ($k_x$). That is, the array 80 depicted in FIG. 2*b* may be considered as a view of stacked k-t space data sets. Therefore, the number of stacked image data sets 82 may be approximately equal to the number of frequency encoding points. It should be noted that the horizontal axis of the image data sets 82 represented in FIG. 2*b* indicates a time progression rather than position/frequency as in FIG. 2*a*. Therefore, the number of columns of data in each of the data sets 82 may be approximately equal to the number of images acquired at respective time points.

In the illustrated embodiment, the column corresponding to the image data set of interest 92 is represented as a bold line in the k-t space data set. Further, the window 90, which is specifically defined for the image data set of interest 92, is shown as encompassing other areas (i.e., other columns of data) of the k-t space, including preceding image data sets 94 and subsequent image data sets 98 including preceding temporal neighbor 96 and subsequent temporal neighbor 100, respectively. Accordingly, in some embodiments of the approaches described herein, the k-t space data sets are used to directly compare phase encoding data points (both sampled and unsampled) in time-adjacent images. In some embodiments, a Fourier transform may be performed along the readout direction (the frequency encoding axis 84) to convert the image data set 82 from k-space ($k_y$-$k_x$) to hybrid space ($k_y$-x) prior to or after the comparison. After the comparison, specific sampled data points neighboring missing data points are selected and used for constructing the missing data.

One such approach to synthesize missing data within an image data set (e.g., within image data set 82) is to exploit spatiotemporal correlations of the image data set with time-adjacent image data sets. Accordingly, FIG. 3 is an illustration of an embodiment of a time-interleaved phase encoding array 110, such as an array of phase encoded points in a series of images acquired over time. Further, it should be noted that the illustrated embodiment depicts the phase encoding data as filling k-t space or hybrid space time series, although the present approaches are also applicable to any data space (e.g., k-space, k-t space, hybrid space). The time-interleaved phase encoding array 110 may be considered as a view of the image data array 80 down the frequency encoding axis 84 (one data set of the embodiment illustrated in FIG. 2b). Therefore, the vertical axis depicted is the $k_y$ or phase encoding axis 86 and the horizontal axis is the time axis 88. While the present discussion is directed towards phase encoding data manipulation and synthesis, it should also be noted that the present embodiments are also applicable to frequency encoding data manipulation and synthesis. Therefore, in some embodiments corresponding to frequency encoding data manipulation and synthesis, other arrays may be possible and would be considered as a view of the image data array 80 down the phase encoding axis 86.

The time-interleaved phase encoding array 110 also includes the time window 90, which has been specifically defined for the image data set of interest 92. As illustrated, the time window 90, in addition to including the image data set of interest 92, includes the preceding temporal neighbor 96 and the subsequent temporal neighbor 100 having neighboring phase encoding data. As noted above, each image data set 82 within the array 110 includes a plurality of sampled phase encoding data points 112 and unsampled phase encoding data points 114, which are depicted as black (filled) circles and white (unfilled) circles, respectively. Additionally, the array 110 includes a set of calibration data, which in the illustrated embodiment is phase encoding data fully sampled at a low frequency portion of the data space. In the present disclosure, these are referred to as autocalibration signals (ACS) 116. It should be noted that the ACS 116 are sampled for every image data set 82 at an area close to the center of the data space, which is typically the low-frequency area of the data space. In sampling data close to the center of the data space, the relative degree of movement of the anatomies (or area) of interest over time may be determined. Therefore, if the ACS 116 were to be synthesized into a set of images, the resultant images would be low-resolution images giving a relative degree of movement between time points. This relative degree of change may be used to determine the time window 90 for each image data set 82.

Additionally, by sampling the same portion of data space for each image data set 82, an accurate spatiotemporal correlation may be drawn between the sampled phase encoding data points 112 and unsampled phase encoding data points 114 within time adjacent image data sets. The correlation between time adjacent image data sets is described in further detail below with respect to FIGS. 5 and 6. In the illustrated embodiment, each image data set 82 (each column) has a fixed number of unsampled phase encoding data points 114 in between each pair of sampled phase encoding points 112, which is an acceleration factor 118. As depicted in the array 110, four unsampled phase encoding data points 114 are between each pair of sampled phase encoding points 112, indicating that the acceleration factor 118 has a value of 5. That is, for every 5 phase encoding steps 120, another phase encoding point is sampled.

As noted above, the value of the acceleration factor 118 also determines the number of image data sets 82 that are suitable for filling an entire data space (e.g., k-space). That is, when the acceleration factor 118 has a value of 5, 5 undersampled time adjacent image data sets 82 represent a set of fully sampled data space. In one example of an accelerated acquisition sequence to obtain the array 110, the phase encoding data is undersampled (along the $k_y$ axis 86) by the phase encoding steps 120 with back-and-forth shifting along the time axis 88, such as by time steps 122. In some embodiments, sampling in this manner allows the distance between unsampled phase encoding data points 114 (e.g., unsampled points 114 in image data set 92) and sampled phase encoding points 112 contained within an immediately adjacent image data set (e.g., sampled points 112 within set 96 and/or set 100) to be reduced. Therefore, in certain of these embodiments, the phase encoding acquisition may not necessarily be "linear". That is, a combination of one phase encoding step 120 and one time step 122 may not necessarily connect one sampled phase encoding point 112 with another sampled phase encoding point 112. In the illustrated embodiment, one time step 122 and three phase encoding steps 120 separate the sampled phase encoding data points 112. Therefore, in some embodiments according to the approaches described herein, the phase encoding acquisition routine is selected such that the contribution from immediately adjacent image data sets during data reconstruction is increased or maximized to maintain sufficient spatial correlation and temporal fidelity.

While the number of phase encoding steps 120 may vary in some embodiments, alternatively or additionally the number of time steps 122 may vary. For example, rather than moving one time step 122 followed by the phase encoding acceleration, the acquisition routine may include more than one time step 122 combined with one or more phase encoding steps 120 between sampled data points. That is, the data acquisition may be time-accelerated and/or phase encoding accelerated. Accordingly, due at least in part to the variable ratio between phase encoding steps 120 and time steps 122, some embodiments utilize "non-linear" phase encoding acquisition, while others employ a linear sampling sequence. The selection of the sampling sequence (linear vs. non-linear) may depend on the size of the data space, desired resolution, time between adjacent image data sets, and so forth.

After performing the sampling sequence and determining the time window 90, a target point 124 within the image data set of interest 92 is constructed using data within the time window 90. In the illustrated embodiment, a time-matched higher phase encoding point 126 and a time-matched lower phase encoding point 128 are selected from within the same image data set 92 as the target point 124 to serve as two weighted inputs for data construction. Additionally, a preceding phase encoding neighbor 130 and a subsequent phase encoding neighbor 132 are used as weighted inputs for constructing the target data point 124. It should be noted that the number of weighted phase encoding inputs may be proportional to the number of image data sets 82 contained within the image data set-specific time window 90. In one embodiment, the correlation performed using the ACS 116 may at least partially determine the size of the time window 90. For example, for time periods during an imaging sequence in which the one or more anatomies of interest are moving quickly (e.g., cardiac systole), the time window 90 may be relatively small compared to time periods of little to no movement (e.g., cardiac diastole), in which the time window 90 would be larger. Due to the relatively short time in between image data sets 82 (e.g., tens of milliseconds), it should be noted that each image data set may be repeated, albeit at a different time point. Accordingly, the imaging routine may be cyclic. In such embodiments, data contained within the edges of the data space (e.g., at the very right or left of k-space) may be constructed using weighted phase encoding inputs from the opposite side of a preceding or subsequent data array.

FIG. 4 is an illustration of one such situation where the one or more anatomies of interest are moving slower than represented by the array 110 (FIG. 3). Specifically, FIG. 4 depicts a time-interleaved phase encoding array 134 having a wider time window 136 than the time window 90 in array 110 (FIG. 3). Therefore, a target data point 138 may be synthesized using a larger number of time-preceding and/or time-subsequent phase encoding neighbors. Accordingly, the time window 136 has been determined specifically for an image data set of interest 140. In the illustrated embodiment, the time window 136 includes a first preceding temporal neighbor 142, a second preceding temporal neighbor 144, a third preceding temporal neighbor 146, and a subsequent temporal neighbor 148. In one embodiment, due to the larger number of preceding temporal neighbors than subsequent temporal neighbors for the image data set of interest 140, the phase encoding data contained within the image data set 140 may be considered to represent substantially no movement (e.g., cardiac diastole) or the onset of movement (e.g., the onset of cardiac systole).

The temporal neighbors present within the illustrated embodiment contain phase encoding neighboring data, which is used in the construction of the target data point 138. More specifically, the target data point 138 is constructed using a weighted sum of sampled phase encoding points 112 having a minimal distance away from the target data point 138. In one embodiment, one sampled phase encoding point 112 is contributed from each image data set 82 within the time window 136, though more than one contribution from neighboring data sets is possible. Further, as with the target data point 124 in time window 90 (FIG. 3), the target data point 138 is also constructed using two sampled time-matched phase encoding points 112 from within the same image data set (image data set of interest 140). The adjacent phase encoding points include a time-matched higher phase encoding point 150, a time-matched lower phase encoding point 152, a subsequent phase encoding neighbor 154, a first preceding phase encoding neighbor 156, a second preceding phase encoding neighbor 158, and a third preceding phase encoding neighbor 160. In general, the target data point 138 is synthesized by calculating a weighted sum of these adjacent phase encoding points within the time window 136 using any technique available in the art. That is, the target data point 138 is constructed by weighted summing, though any data synthesis method may be applied to the present approaches. Some data synthesis techniques may include analytical pseudo-inversion, iterative conjugate gradient, and so forth.

According to some of the above techniques, the weight given to each phase encoding neighbor for interpolation may be determined by the correlation of their respective image data sets with the image data set of interest 140. The weights are thus determined by comparing the ACS 116 for each data set. In one embodiment, the pattern of sampled phase encoding data points relative to the target data point 138 may be used for determining the weight of each neighbor. For example, the pattern of the neighboring, sampled phase encoding points as they relate to the target data point 138 may determine which points within the ACS 116 are compared. In one weight calculation method, the pattern relating to the target data point 138 may be superimposed on the ACS 116. In such an embodiment, the correlation between the sampled point within the ACS 116 corresponding to the target data point 138 may be compared to the sampled point within the ACS 116 corresponding to the position of the third preceding phase encoding neighbor 160 relative to the target data point 148 (i.e. one time step before and one phase encoding step down). The correlation between these two sampled phase encoding points in the ACS 116 may at least partially determine the weight given to the third preceding phase encoding neighbor 160 during synthesis of the target data point 138.

The ACS 116 is useful in determining weights of phase encoding neighbors, as well as determining which phase encoding neighbors may be included within the time window for data synthesis. Therefore, in a broader sense, the consistency between an image data set of interest (e.g., image data set 92 or 140) and a temporal neighbor may be represented by a calculated deviation between the two. That is, the calculated deviation may represent the extent that an image (e.g., one or more anatomies of interest) is changing from one time to another. In one embodiment, the deviation may be calculated as the deviation between the total ACS 116 of each temporal neighbor with the total ACS 116 of the image data set of interest 92, rather than discrete points within the ACS 116 as performed in determining respective weights. That is, by performing a k-space subtraction of the ACS 116 between a pair of images, the consistency between phases may be estimated. In some embodiments, the deviation may be calculated as a norm function of the k-space data difference. For example, the deviation may be calculated using the following equation:

$$DEV_{n,m} = \sum_{l} \sum_{k_x k_y} \|F_{n,l}(k_x, k_y) - F_{m,l}(k_x, k_y)\|^2 \quad (1)$$

where $F_{n,l}(k_x, k_y)$ is the ACS 116 for each image data set 82, n and m are phase indices, and l is the coil index. In other embodiments, it may be desirable to calculate the deviation between portions of successive time images, such as successive time images where some portions of the reconstructed images remain substantially motionless and others exhibit detectable motion. Accordingly, in some embodiments, the time window 90 may be calculated for portions of each image data set 82, rather than substantially only the lower phase encoding values. In such embodiments, each image data set 82 could encompass one or more time windows 90 having fully sampled autocalibration signals in areas not limited to any one portion (e.g., the center) of the data space. Further, the image data sets 82 may include more than one set of autocalibration signals. For example, the image data sets 82 could contain fully sampled autocalibration signals at the center and the periphery of the data space, or at mid-range frequencies. Indeed, the present approaches are applicable to all data sets having autocalibration signals for which a spatiotemporal correlation can be made.

Figure 5:
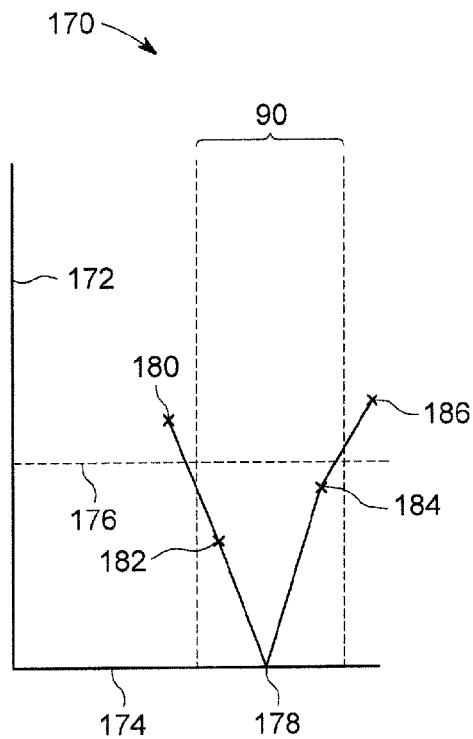
FIG. 5 is an illustration of a plot of deviation versus phase shift for determining the adaptive time window depicted in FIG. 3, in accordance with an aspect of the present disclosure.

To perform a spatiotemporal correlation to determine an image data set-specific time window, the calculated deviations between image data sets may be represented as a plot of calculated deviation versus phase shift, with each image data set having a distinct plot. FIG. 5 is an illustration of one such plot 170 of calculated deviation 172 between the ACS 116 of the image data sets that are time-adjacent to the image data set of interest 92 versus phase shift 174. Additionally, a threshold deviation 176 is illustrated as a cutoff value to determine the time window 90. That is, the time window 90 includes all phase encoding points or image data sets 82 having a deviation value at or below the threshold deviation 176. According to the present embodiments, the threshold deviation 176 is defined as the median value of calculated deviation (using, for example, equation (1)) between all image data sets performed for each image data set in a given array. However, in other embodiments, the threshold deviation 176 may be a mean of the calculated deviations, a mode of the calculated deviations, and so forth.

In the illustrated embodiment of FIG. 5, the deviation has been calculated for a point 178, which is representative of the image data set of interest 92 of array 110 (FIG. 3), though the present embodiment is applicable to any image data set that is missing data points. Accordingly, the point 178 may be considered to be at a position of (0, 0) within the plot 170. As noted above, the threshold deviation 176 determines which time-adjacent image data sets are included within the time window 90 calculated for the image data set of interest 92 (FIG. 3). For example, in the illustrated embodiment a point 180 is representative of a calculated deviation of a rejected preceding temporal neighbor. That is, the point 180 is above the threshold deviation 176 and thus, its respective image data set is not included within the time window 90.

Conversely, a point 182 is representative of a calculated deviation of an accepted preceding temporal neighbor. In the illustrated embodiment, the point 182 is representative of the deviation of the preceding temporal neighbor 96 (FIG. 3). Similarly, a point 184 is representative of a calculated deviation value for an accepted subsequent temporal neighbor, which in the present embodiment is the subsequent temporal neighbor 100 (FIG. 3). In a similar manner to point 180, a point 186 is representative of a calculated deviation between a rejected subsequent temporal neighbor and the image data set of interest 92. As illustrated, the point 186 is above the threshold deviation 176 and thus, is not included within the time window 90.

Figure 6:
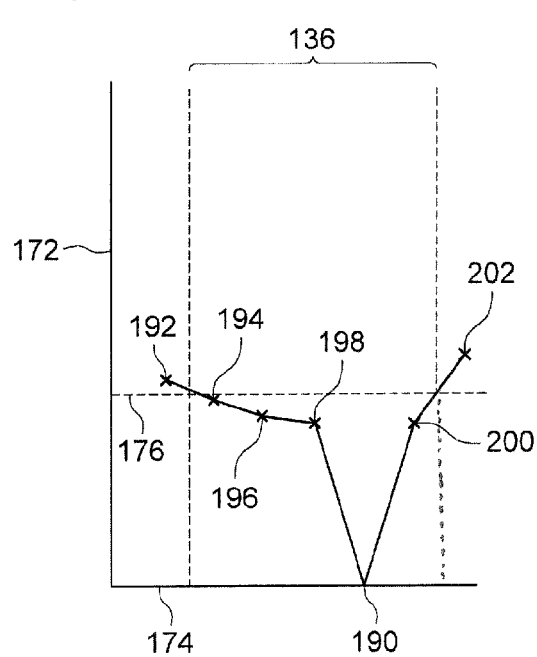
FIG. 6 is an illustration of a plot of deviation versus phase shift for determining the variable time window depicted in FIG. 4, in accordance with an aspect of the present disclosure.

As noted above, each image data set may have a distinct plot of calculated deviation versus phase shift, which determines the time window for the respective image data set. The plot of FIG. 6 is an illustration of a plot 188 of calculated deviation 172 versus phase shift 174 that is similar to that depicted in FIG. 5, but corresponding to the time window determination for the image data set of interest 140 illustrated in FIG. 4. A point 190 represents the image data set of interest 140. As noted above with respect to FIG. 4, the time window 136 calculated for the image data set of interest 140 includes three preceding temporal neighbors (142, 144, and 146) and one subsequent temporal neighbor 148. Accordingly, the plot 188 includes a point 192 that is representative of a calculated deviation of a rejected preceding temporal neighbor, as the value of the calculated deviation at point 192 is above the threshold deviation 176. It should be noted that the threshold deviation 176 is the same for both plots 170 and 188, as well as arrays 110 and 134, as the threshold deviation 176 is determined by calculating the median deviation for all image data sets 82 within the array 80 (FIGS. 2a and 2b).

As noted above with respect to FIG. 4, the time window 136 includes preceding temporal neighbors 142, 144, and 146. Accordingly, in FIG. 6, points 194, 196, and 198, respectively, represent their calculated deviations from the image data set of interest 140 (FIG. 4). Of course, the values of points 194, 196, and 198 fall below the threshold deviation 176. FIG. 4 also illustrates the subsequent temporal neighbor 148 as being included within the time window 136. Thus, in FIG. 6 a point 200 is representative of its calculated deviation from the image data set of interest 140 (FIG. 4). It should be noted that the time window 136, as depicted in FIG. 4, includes the three preceding temporal neighbors 142, 144, and 146, as well as the single subsequent temporal neighbor 148. Therefore, any image data sets 82 sampled after the subsequent temporal neighbor 148 are not included within the time window 136. In the plot 188 of FIG. 6, a point 202 represents an image data set having a calculated deviation that is above the threshold deviation 176. As such, its respective image data set is not included within the time window 136.

Figure 7:
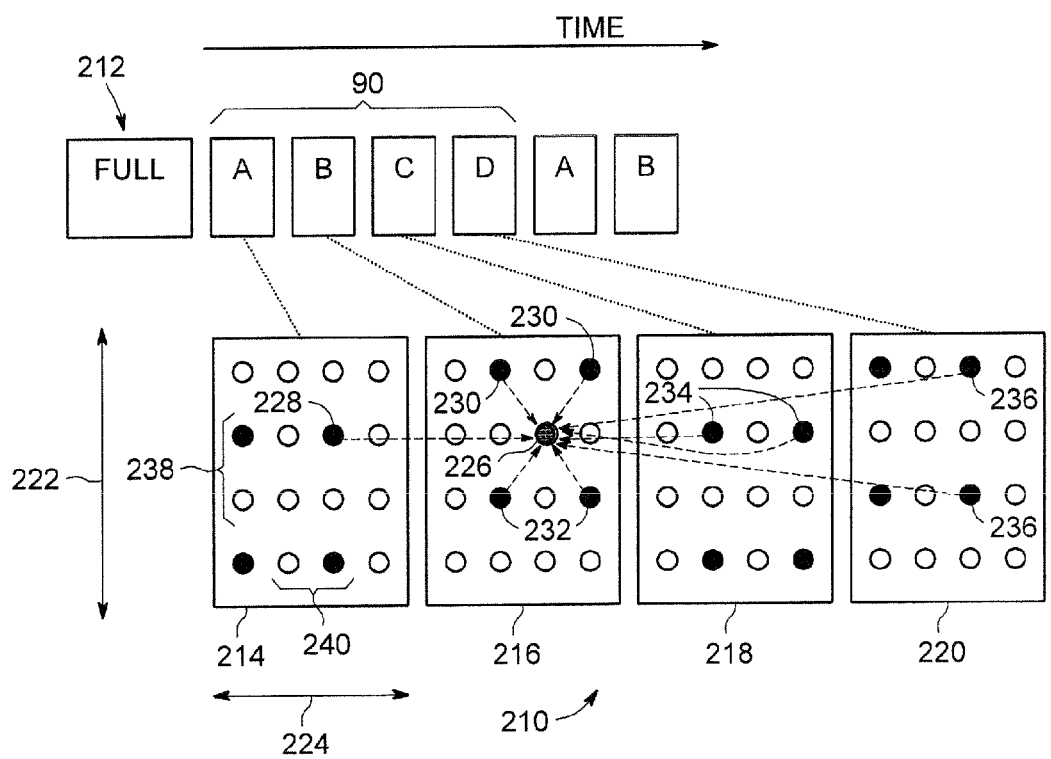
FIG. 7 is a diagrammatical illustration of an embodiment of a time series of phase encoding data sets acquired in an accelerated three-dimensional imaging sequence, in accordance with an aspect of the present disclosure.

While the preceding discussion has been described with respect to a series of 2D (planar) images taken over time, it should be noted that the approaches described within the present disclosure are also applicable to reconstructing missing data in 3D image data sets. Therefore, the approaches described herein are applicable to imaging methods such as 3D dynamic contrast-enhanced imaging, which allows a user to measure, for example, perfusion kinetics. Other applications may include 3D cine imaging or any other dynamic 3D MRI method. For example, FIG. 7 is an illustration of a time series 210 of 3D image data sets 212, which is similar to the 2D time-interleaved phase encoding arrays 110 and 134 of FIGS. 3 and 4, respectively.

As with the 2D approaches described above, the methods for 3D missing data reconstruction include defining the temporal window 90 with respect to an image data set. However, unlike the embodiments depicted in FIGS. 3 and 4, the time window 90 encompasses two-dimensional representations of the 3D image data sets, rather than one-dimensional columns (such as the column 92 representing the image data set of interest in FIG. 3). The time series 210 includes a "full" initial scan, which contains fully sampled data for all of the represented data space. For example, in a dynamic contrast-enhanced (DCE) imaging sequence, the full initial scan would be performed before injection of the contrast agent. In a cardiac cine scan sequence, the full initial scan could optionally be obtained during cardiac diastole (i.e., a period of substantially no motion). A k-t undersampled acquisition routine is then performed, for example for DCE imaging. The acquisition routine results in the series 210 of 3D data sets 212 over time having sampled phase encoding points and areas or points that have not been sampled, as in FIGS. 3 and 4. Due to the relatively short time frame in between images (e.g., tens of milliseconds), it should be noted that the k-t undersampling acquisition routine may be cycled. That is, the routine may perform the same sampling on the same area at different times. Such an embodiment can be appreciated in FIG. 7 where the 3D image data sets 212 progress over time, from A to B to C to D, then back to A, and so forth until the 3D imaging routine is complete. Therefore, the series 210 includes a first 3D image data set 214, a second 3D image data set 216, a third 3D image data set 218, and a fourth 3D image data set 220.

According to the present approaches, the k-t undersampling acquisition routines for the 3D image data sets 212 are performed in $k_z$-$k_y$-t space in a time-alternating fashion. Therefore, each 3D image data set 212 includes a $k_y$ phase encoding axis 222 and a $k_z$ phase encoding axis 224. Further, the time-alternating sampling results in minimal phase encoding differences between unsampled (white circle) and sampled (dark circle) points. As such, the construction of a target data point, such as a target data point 226, may utilize phase encoding neighbors with sufficient temporal fidelity and spatial correlation to generate an acceptable reconstructed image. In some embodiments, prior to missing data construction, dynamic k-space may be calculated by performing a mask subtraction at each time point using the full image data set. In such embodiments, the dynamic k-space is then converted to hybrid space by Fourier transforming along the frequency encoding axis ($k_x$, which would orthogonally extend through the plane of each 3D image data set 212).

An image data set-specific time window, such as the time window 90, is then determined for each 3D image data set 212 using the approaches described above with respect to FIGS. 3-6. Specifically, the ACS 116 are compared between each 3D image data set 212 to determine the relative degree of change between images. It should be noted that in a DCE imaging routine, the fully sampled ACS 116 would exhibit a change as the contrast agent perfuses through the anatomies of interest being imaged. Once the time window 90 has been defined for the image data set of interest, such as the second 3D image data set 216 containing the target data point 226, the missing data is constructed by interpolation using immediately adjacent phase encoding neighbors and a sampled phase encoding point that has been sampled at the same position as the target data point 226.

In total, in this example, the target data point 226 is constructed using nine (9) weighted phase encoding points, including eight (8) phase encoding neighbors and a matched phase encoding point 228. In the illustrated embodiment, the target data point 226 is constructed using the matched phase encoding point 228 that has been sampled at the same position on the $k_y$ and $k_z$ axis as the target data point 226, but at a preceding time within the first 3D image data set 214. Additionally, the target data point 226 is constructed using four time-matched phase encoding points. That is, the time-matched phase encoding points are within the same 3D image data set 216. Accordingly, a pair of time-matched higher phase encoding neighbors 230 and a pair of time-matched lower phase encoding neighbors 232 are used as weighted inputs for interpolating the target data point 226. The time window 90, defined for the second 3D image data set 216, also includes two subsequent temporal neighbors, including the third 3D image data set 218 and the fourth 3D image data set 220. Accordingly, a pair of lateral phase encoding neighbors 234 within the third 3D image data set 218 along with a pair of vertical phase encoding neighbors 236 within the fourth 3D image data set 220 are used as weighted inputs for interpolating the target data point 226. The weighting factor for each input is calculated as described above with respect to the calculation of deviation described for FIGS. 5 and 6. In one embodiment, lateral phase encoding neighbors may be weighted based upon the calculations described above with respect to data construction for 2D images.

According to the present approaches, the degree to which the dynamic 3D imaging routine is accelerated, from a data acquisition standpoint, is at least partially dependent on the ratio of unsampled phase encoding points to sampled phase encoding points, i.e., the acceleration factor (AF). With regard to FIGS. 3 and 4, it should be noted that the acceleration factor 118 for the time-interleaved phase encoding arrays 110 and 134 are defined as the number of phase encoding steps 120 from one sampled phase encoding point 112 to another (in the vertical direction). That is, the acceleration factor 118 is a one-dimensional acceleration. Similarly, the acceleration factor for the time series of 3D image data sets 210 includes two one-dimensional accelerations. That is, the acceleration factor for the time series 210 is a two-dimensional acceleration, with one acceleration being along the vertical, or $k_y$ axis 222, and the other being along the horizontal, or $k_z$ axis 224. Accordingly, in FIG. 7, one accelerated dimension is a $k_y$ phase encoding acceleration 238, and the other is a $k_z$ phase encoding acceleration 240. For both of the $k_y$ and $k_z$ phase encoding accelerations 238 and 240 depicted in FIG. 7, there is one unsampled data point in between each pair of sampled phase encoding data points, resulting in an acceleration factor of 2 for each. Therefore, the acceleration factor for the time series 210 may be represented as a two-dimensional acceleration factor of (2×2).

Figure 8:
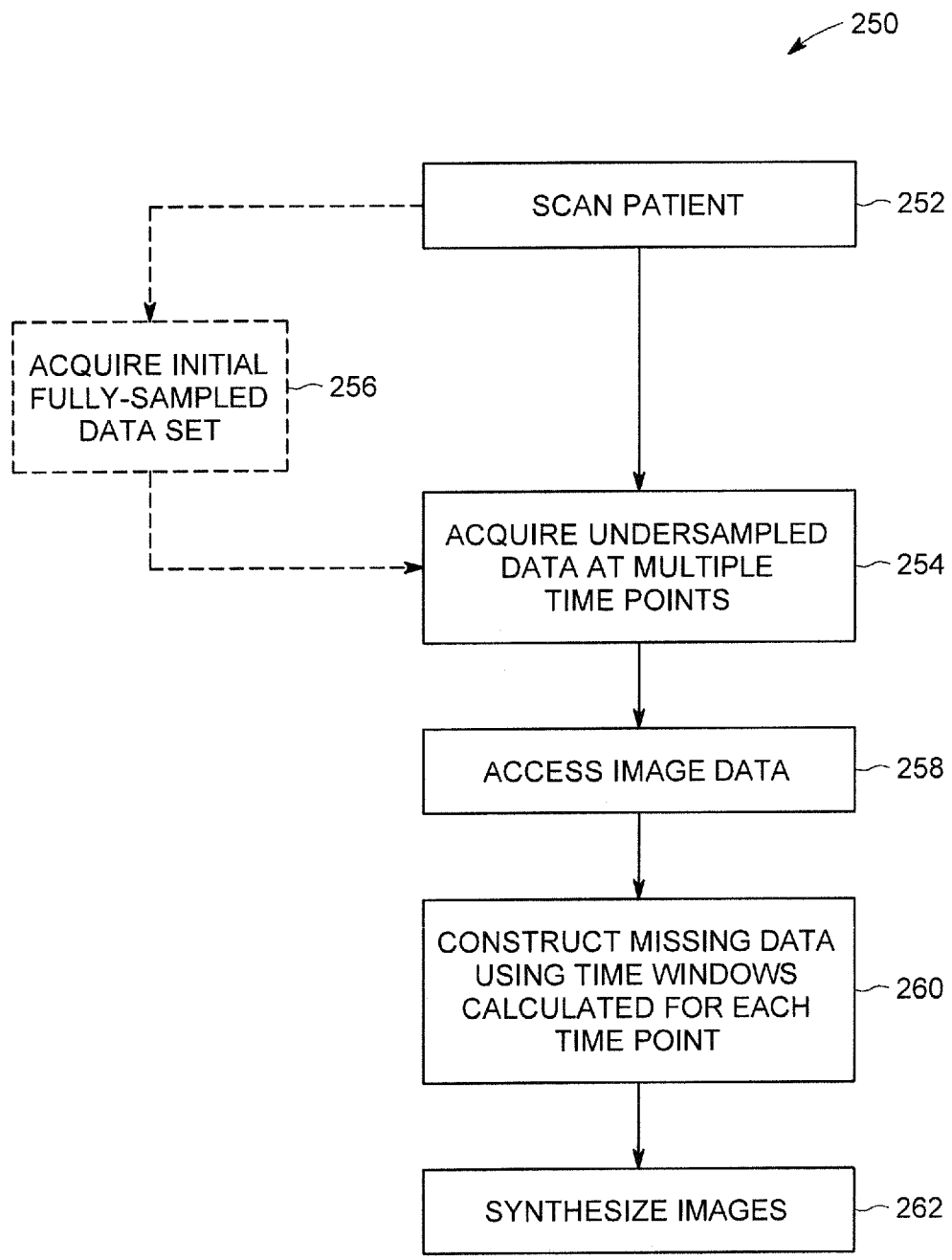
FIG. 8 is a process flow diagram of an embodiment of a method of accelerated patient imaging, in accordance with an aspect of the present disclosure.

According to the present disclosure, the representative arrays, plots, and time series described above with respect to FIGS. 2-7 are representative of image data sets acquired and/or stored on an imaging system, such as the imaging system 10 illustrated in FIG. 1. It should be noted that the processes of time window determination, missing data reconstruction, image synthesis, and so forth may be performed by one or more processing components of the system 10. For example, the scanner control circuitry 14 and the system control circuitry 16 depicted in FIG. 1 may perform accelerated imaging sequences and image data reconstruction, respectively. Accordingly, the system 10 may be configured to perform a method 250 of patient imaging, which is illustrated in FIG. 8. Specifically, FIG. 8 is a process flow diagram depicting a method of patient imaging using an accelerated data acquisition imaging routine.

In both 2D and 3D dynamic MRI modalities, the patient 26 is scanned (block 252), for example to encode positional information into one or more gyromagnetic materials within the patient 26 (e.g., the hydrogen within fluids and/or tissues, an injected contrast agent) and to receive signals representative of the encoding in a controlled manner. Subsequently, an accelerated data acquisition process is carried out wherein undersampled image data sets are acquired at multiple time points (block 254). In some embodiments, an initial, fully sampled image data set may optionally be acquired (block 256) before the undersampled image data sets are acquired (block 254). In such embodiments, the fully sampled image data set is subtracted from subsequently-acquired accelerated data sets to reduce artifacts from static entities (i.e. substantially non-moving entities) in the image.

In addition to or in lieu of the processing described above, additional processing may be performed prior to missing data construction. One such application may include cardiac imaging with retrospective cardiac gating. In retrospective cardiac gating, processing may include remapping acquired image data along the time axis 88 based on internal or external synchronization signals (e.g. an electrocardiogram signal). That is, the image data sets resulting from an accelerated imaging sequence may be synchronized with various dynamic processes, such as a heartbeat, during or after imaging. In one embodiment, the data processing retrospectively resynchronizes data acquisition with certain physiological process or MR signal dynamics (e.g. cardiac motion). Such processing includes but is not limited to linear temporal interpolation, nearest neighbor interpolation, and so forth. After the data has been optionally pre-processed, the undersampled image data sets may be stored for later use or for remote manipulation. The undersampled image data sets may be stored on a hard drive, optical storage medium, non-volatile memory, or similar storage device, and are accessed (block 258) by a user (e.g., a radiologist) with software or automatically by software having one or more algorithms for performing data analysis, data construction, and image synthesis.

Once the image data has been accessed (block 258), the missing data within the undersampled image data sets 82 are then constructed using the time window 90 calculated for each image data set 82, as described with respect to FIGS. 2-7 above. That is, after the data has been accessed and optionally manipulated, the sampled data of the image data sets 82 within the time window 90 are then used to fully fill the data space (block 260). Using the image data sets having constructed data points, their representative images are then synthesized (block 262). For example, an inverse Fourier transform may be performed on the fully-filled data space to generate the respective images. In embodiments where a fully-sampled image is taken prior to the accelerated acquisition (and subsequently subtracted from the accelerated image data sets), the fully sampled image is added back to the newly synthesized images.

Figure 9:
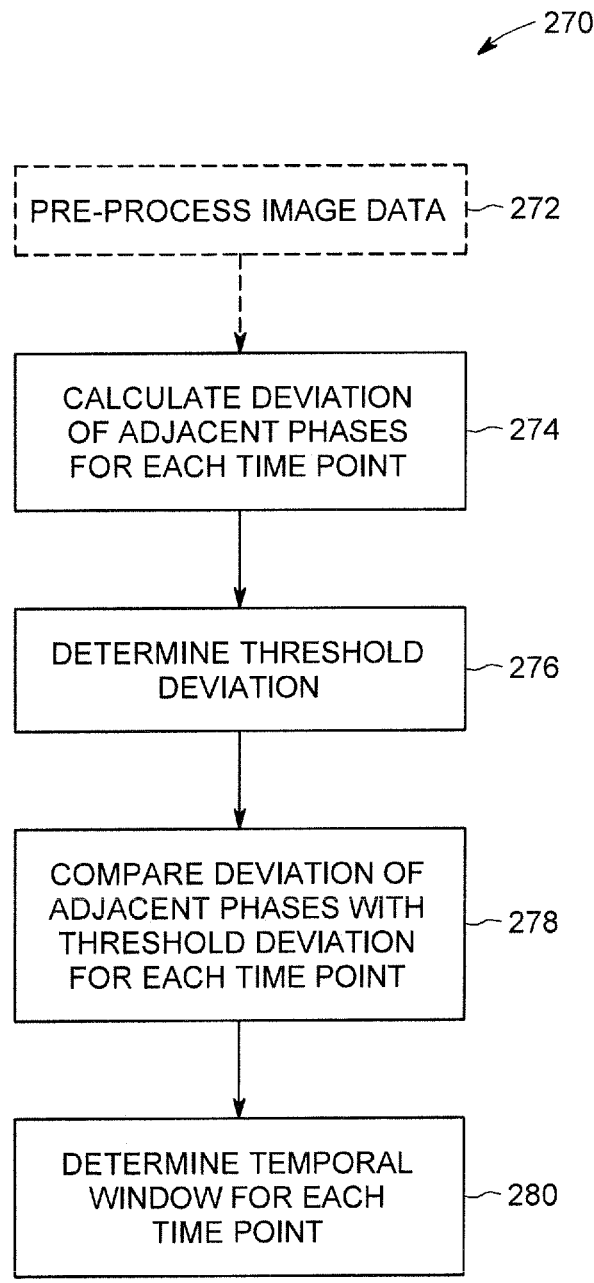
FIG. 9 is a process flow diagram of an embodiment of a method of determining an adaptive time window, in accordance with an aspect of the present disclosure.

As noted above, to construct the missing data within the image data sets 82, the time-specific time window 90 is determined for each image data set 82 (e.g., the image data set of interest 92 in FIG. 3). The time window determination, as mentioned, may be performed by one or more processing components within the system 10 illustrated in FIG. 1. FIG. 9 is a process flow diagram depicting one such method 270 for determining time (temporal) windows within an image data set array (e.g., the image data array 80 in FIGS. 2a and 2b. To begin the method 270, the image data (e.g., the time-interleaved phase encoding data array 110 of FIG. 3) may optionally be pre-processed (block 272). For example, the image data sets 82 may be transformed from k-t space to hybrid space. In another example, the image data sets 82 may be converted from dynamic k-space to hybrid space, and/or a mask subtraction may be performed using a fully sampled image data set to convert k-space to dynamic k-space. Nevertheless, once the image data is in a desired form, deviations are calculated (block 274) for every image data set 82 in relation to every other image data set 82 within the image data array 80 (FIGS. 2a and 2b). The threshold deviation is then determined (block 276) based on the deviations that are calculated (block 274). For example, as mentioned above with respect to FIGS. 5 and 6, the threshold deviation may be a median of the deviations, a mode of the deviations, a mean of the deviations, and so on. After the threshold deviation has been determined (block 276), the deviations calculated for each image data set 82 are compared to the threshold deviation (block 278) to determine which neighboring image data sets 82 are acceptable for inclusion within the time window for that respective data set (block 280). This step (block 278) is performed for each image data set 82 until a time window has been determined for each set (block 280).

Figure 10:
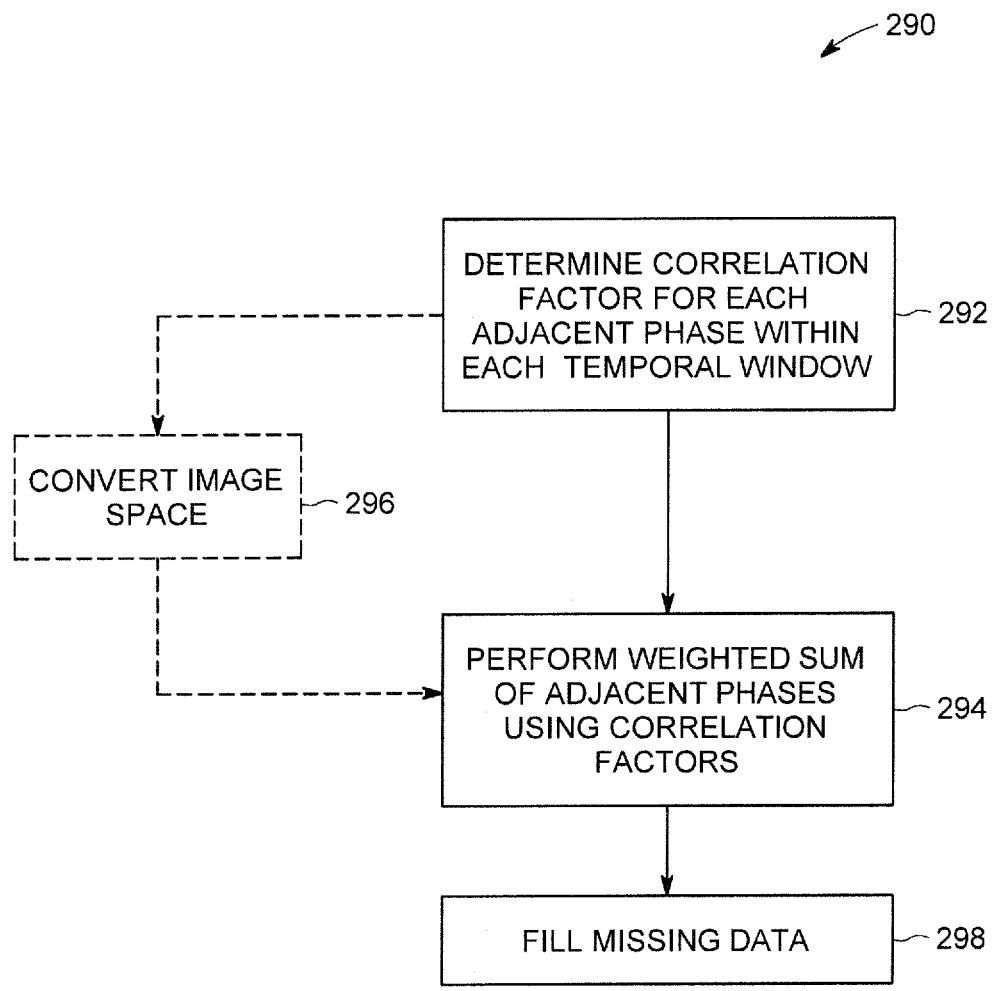
FIG. 10 is a process flow diagram of an embodiment of a method of synthesizing missing data within an image data set acquired in an accelerated imaging sequence, in accordance with an aspect of the present disclosure.

Once a time window has been determined for each image data set (e.g., image data set 82) within an image data array (e.g., array 80), missing data within each of the image data sets can be constructed using, for example, phase encoding neighbors from the same and/or time-adjacent image data sets within their respective time windows. Accordingly, the present approaches provide a method 290, illustrated in FIG. 10, of constructing missing data within the image data sets (e.g., image data sets 82) using the time windows determined in method 270. For example, the time window 90, as described with respect to FIGS. 5 and 6, is determined for each image data set 82 by calculating deviations between autocalibration signals of a time-adjacent image data set and the image data set of interest. Pattern-driven correlation methods relating to the ACS 116 are then used to determine correlation factors for every adjacent phase encoding point as they relate to each target data point (block 292).

Using the correlation factors, weighted summing is performed (block 294) to construct each target data point. In some embodiments, the data space may optionally be converted (block 296), such as to improve computational efficiency or to reduce image artifacts before performing the weighted sum. For example, the data space containing the image data sets 82 may be converted from k-space to hybrid space. In another example, a mask subtraction may be performed on a time series of image data using a fully filled k-space data set, which will then be added back after image construction. The weighted inputs (weighted phase encoding neighbors) are then weight-summed to arrive at a value that is used to construct the missing data point. This is performed for each area or point missing data, until all of the missing data has been filled (block 298).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for processing magnetic resonance imaging data, comprising:
   accessing the magnetic resonance imaging data, the data including a plurality of data sets, each data set of the plurality of data sets defining a reconstructable image representative of a subject at a different point in time, each data set including sampled data for sampled phase encoding points but missing data for unsampled phase encoding points;
   determining a time window for at least one data set in the plurality of data sets, wherein the time window for the at least one data set encompasses the at least one data set and at least one additional data set in the plurality of data sets; and
   determining the missing data of the at least one data set based upon the sampled data for the at least one data set and sampled data from the at least one additional data set within the time window for the at least one data set.

2. The method of claim 1, wherein individual points of the missing data are determined based upon the sampled data from the at least one data set at phase encoding points different from those from the respective individual missing data points.

3. The method of claim 1, wherein the missing data is determined by a combination of multiple sampled data points acquired at different times within the time window.

4. The method of claim 1, wherein the time windows for different data sets include a different number of data sets adjacent to the respective data set in time.

5. The method of claim 1, wherein missing data for the at least one data set is determined based upon a single time window or more than one time window.

6. The method of claim 1, wherein the time window for the at least one data set is determined in k-space.

7. The method of claim 1, comprising converting the magnetic resonance imaging data from data in k-space to data in hybrid space, and determining the missing data based upon the sampled data in k-t space, wherein the magnetic resonance imaging data is converted by application of a 1D fast Fourier transform to the magnetic resonance imaging data.

8. The method of claim 7, wherein the time window for the at least one data set is determined based upon the data in k-t space.

9. The method of claim 1, wherein determining the missing data of the at least one data set based upon the sampled data for the at least one data set and sampled data from the at least one additional data set within the time window comprises the acts of:

determining a correlation factor for the sampled data from the at least one additional data set based upon a pattern-driven analysis of autocalibration signals sampled for the at least one data set and the at least one additional data set; and constructing the missing data by performing a weighted sum of the sampled data from the at least one additional data set, wherein the weighting for each sampled data from the additional data set is defined by the correlation factor.

10. The method of claim 1, wherein the time window for the at least one data set is determined based upon a comparison between autocalibration signals sampled for the at least one data set and the at least one additional data set within the plurality of data sets.

11. The method of claim 1, comprising determining respective time windows for each data set of the plurality of data sets, wherein determining the respective time windows comprises the acts of:

determining a consistency between each respective data set and other data sets within the plurality of data sets;

selecting, for each respective data set, the respective time window encompassing the respective data set and at least one of the other data sets having a consistency that meets a pre-defined requirement.

12. A method for processing magnetic resonance imaging data, comprising:

accessing the magnetic resonance imaging data, the data including a plurality of data sets, each data set of the plurality of data sets defining a reconstructable image representative of a subject at a different point in time, each data set including sampled data for sampled phase encoding points but missing data for unsampled phase encoding points, the sampled phase encoding points of time-adjacent data sets differing from one another by more than one phase encoding step;

determining a time window for at least one data set in the plurality of data sets, wherein the time window for the at least one data set encompasses the at least one data set and at least one additional data set in the plurality of data sets; and determining the missing data of the at least one data set based upon the sampled data for the at least one data set and sampled data from the at least one additional data set within the time window.

13. The method of claim 12, wherein the time window for the at least one data set is different from the time window for at least one other data set.

14. The method of claim 12, wherein the at least one data set contains data within a data space, and the data space is k-space having a frequency encoding axis and a phase encoding axis.

15. The method of claim 14, comprising performing a 1D fast Fourier transform along the frequency encoding axis of the k-space to generate a hybrid space having a phase encoding axis and a position axis for the at least one data set.

16. The method of claim 15, wherein determining the time window for the at least one data set comprises comparing a deviation of autocalibration signals sampled for the at least one data set and the at least one additional data set within the plurality of data sets.

17. A method for processing magnetic resonance imaging data, comprising:

accessing the magnetic resonance imaging data, the data including a plurality of data sets, each data set of the plurality of data sets defining a reconstructable image representative of a subject at a different point in time, each data set including sampled data for sampled phase encoding points but missing data for unsampled phase encoding points;

determining a time window for at least one data set in the plurality of data sets based upon calibration data in k-t space, wherein the time window for the at least one data set encompasses the at least one data set and at least one additional data set in the plurality of data sets;

performing a 1D fast Fourier transform on the magnetic resonance imaging data to convert the magnetic resonance imaging data from data in k-space to data in hybrid space; and determining the missing data of the at least one data set based only upon the sampled data for the at least one data set and sampled data from the at least one additional data set within the time window.

18. The method of claim 17, wherein the sampled phase encoding points of time-adjacent data sets differ from one another by more than one phase encoding step.

19. The method of claim 17, wherein determining the time window for the at least one data set based upon calibration data in hybrid space comprises the acts of:

calculating, for the at least one data set, a deviation value between the at least one data set and the at least one additional data set, wherein the deviation value is representative of the deviation between autocalibration signals sampled for the at least one data set and the at least one additional data set;

determining a threshold deviation for the at least one data set;

comparing the deviation of the at least one additional data set with the threshold deviation for the at least one data set; and defining the time window based upon the number of time-adjacent additional data sets in the plurality of data sets having respective deviations less than or approximately equal to the threshold deviation.

20. The method of claim 17, wherein determining the missing data of the at least one data set based upon the sampled data for the at least one data set and sampled data from the at least one additional data set within the time window comprises the acts of:

determining a correlation factor for the sampled data from the at least one additional data set based upon a pattern-driven analysis of autocalibration signals sampled for the at least one data set and the at least one additional data set; and constructing the missing data by performing a weighted sum of the sampled data from the at least one additional data set, wherein the weighting for each sampled data is defined by the correlation factor.

\* \* \* \* \*